United States Patent
Han et al.

(10) Patent No.: US 11,456,409 B2
(45) Date of Patent: Sep. 27, 2022

(54) MICRO-VIBRATION SENSOR AND PREPARATION METHOD THEREOF

(71) Applicant: JILIN UNIVERSITY, Jilin (CN)

(72) Inventors: Zhiwu Han, Changchun (CN); Kejun Wang, Changchun (CN); Honglie Song, Changchun (CN); Junqiu Zhang, Changchun (CN); Daobing Chen, Changchun (CN); Linpeng Liu, Changchun (CN); Binjie Zhang, Changchun (CN); Tao Sun, Changchun (CN); Dakai Wang, Changchun (CN); Changchao Zhang, Changchun (CN)

(73) Assignee: JILIN UNIVERSITY, Changchun (CN)

( * ) Notice: Subject to any disclaimer, the term of this patent is extended or adjusted under 35 U.S.C. 154(b) by 262 days.

(21) Appl. No.: 16/771,190

(22) PCT Filed: Oct. 31, 2019

(86) PCT No.: PCT/CN2019/114585
§ 371 (c)(1),
(2) Date: Jun. 9, 2020

(87) PCT Pub. No.: WO2020/093921
PCT Pub. Date: May 14, 2020

(65) Prior Publication Data
US 2021/0175411 A1     Jun. 10, 2021

(30) Foreign Application Priority Data

Nov. 8, 2018    (CN) .......................... 201811326680.0

(51) Int. Cl.
*H01L 41/312*    (2013.01)
*G01H 11/08*    (2006.01)
*H01L 41/297*    (2013.01)

(52) U.S. Cl.
CPC .......... *H01L 41/312* (2013.01); *G01H 11/08* (2013.01); *H01L 41/297* (2013.01)

(58) Field of Classification Search
CPC ..... H01L 41/312; H01L 41/29; H01L 41/297; G01H 11/08
See application file for complete search history.

(56) References Cited

U.S. PATENT DOCUMENTS

| 4,999,819 A | 3/1991 | Newnham et al. |
| 6,858,970 B2 * | 2/2005 | Malkin ............... H01L 41/1136 310/329 |

(Continued)

FOREIGN PATENT DOCUMENTS

| CN | 104523231 A | 4/2015 |
| CN | 204924795 A | 12/2015 |

(Continued)

OTHER PUBLICATIONS

English translation of International Search Report dated Feb. 5, 2020 in corresponding International application No. PCT/CN2019/114585; 3 pages.

*Primary Examiner* — Jeffrey T Carley
(74) *Attorney, Agent, or Firm* — Maier & Maier, PLLC

(57) ABSTRACT

A micro-vibration sensor and preparation method thereof. The method includes a metal sheet is coated with first curing material, and first curing material is cured into first cured layer; piezoelectric thin film element is attached to edge of first cured layer; one side, attached with piezoelectric thin film element, of first cured layer is vertically placed into second curing material, and second curing material is cured into second cured layer; and metal sheet is removed to obtain micro-vibration sensor. Due to fact that piezoelectric thin film element is arranged at a crack tip, during micro-vibration, stress in stress field of crack tip is rapidly increased due to crack stress deformation, and stress signal (Continued)

is efficiently converted into electric signal; and microvibration sensor has characteristics of being low in detection limit and high in accuracy.

15 Claims, 4 Drawing Sheets

(56) References Cited

U.S. PATENT DOCUMENTS

| | | | | |
|---|---|---|---|---|
| 7,259,032 | B2* | 8/2007 | Murata | H03H 9/0557 257/684 |
| 7,562,557 | B2* | 7/2009 | Bennett | B06B 1/06 310/365 |
| 8,704,316 | B2* | 4/2014 | Nguyen | B81C 1/00484 257/415 |
| 10,911,021 | B2* | 2/2021 | Turner | H03H 9/17 |
| 2003/0197448 | A1* | 10/2003 | Tanielian | H02N 2/186 310/328 |
| 2004/0233174 | A1* | 11/2004 | Robrecht | G06F 3/0433 345/173 |
| 2006/0113878 | A1* | 6/2006 | Pei | H01L 41/113 310/363 |
| 2011/0000060 | A1* | 1/2011 | Lee | H01L 27/20 29/25.35 |
| 2013/0234805 | A1* | 9/2013 | Takahashi | H01L 41/29 29/25.35 |
| 2015/0165479 | A1* | 6/2015 | Lasiter | B06B 1/0666 29/25.35 |
| 2020/0035654 | A1* | 1/2020 | Chen | H01L 25/0655 |

FOREIGN PATENT DOCUMENTS

| | | |
|---|---|---|
| CN | 105612588 A | 5/2016 |
| CN | 107202538 A | 9/2017 |
| CN | 108444377 A | 8/2018 |
| CN | 109341843 A | 2/2019 |
| CN | 112039461 A * | 12/2020 |

* cited by examiner

MICRO-VIBRATION SENSOR AND PREPARATION METHOD THEREOF

CROSS-REFERENCES TO RELATED APPLICATIONS

This application is a national stage application of PCT Patent Application No. PCT/CN2019/114585, filed on Oct. 31, 2019, which claims priority to Chinese Patent Application No. 201811326680.0, filed on Nov. 8, 2018, the content of all of which is incorporated herein by reference.

FIELD

The present invention relates to the field of sensors, and more particularly, to a micro-vibration sensor and a preparation method thereof.

BACKGROUND

In an ultra-precision machining process, a micro-vibration may have a great influence on a surface quality of a workpiece at a micron-level/nano-level. When a vibration sensor in the prior art performs a high-precision micro-vibration test and analysis for a precision/ultra-precision machining environment, a measurement accuracy thereof is relatively low.

Therefore, the current technology needs to be improved and developed.

SUMMARY

According to the above described defects in the prior art, the purpose of the present invention is to provide a micro-vibration sensor and a preparation method thereof, in order to solve the problem that a vibration sensor in the prior art has a relatively low measurement accuracy.

A technical solution of the present invention to solve the technical problem is as follows:

A preparation method for a micro-vibration sensor, wherein comprising a plurality of following steps:

Coating a first curing material onto a thin metal sheet, and curing the first curing material into a first cured layer;

sticking a piezoelectric thin film element onto an edge of the first cured layer;

placing a side of the first cured layer with the piezoelectric thin film element stuck vertically into a second curing material, and curing the second curing material into a second cured layer;

removing the metal sheet, and obtaining the micro-vibration sensor.

The preparation method, wherein the piezoelectric thin film element is formed by packaging after connecting an electrode onto each of both sides of a piezoelectric thin film.

The preparation method, wherein the piezoelectric thin film is made of at least one of a polyvinylidene fluoride, a zinc oxide, a piezoelectric material of $PbTiO_3$, a piezoelectric crystal or a piezoelectric ceramic.

The preparation method, wherein the electrode is formed by depositing, evaporating, sputtering or brushing an electrode material onto the piezoelectric thin film.

The preparation method, wherein the electrode material adopts at least one of copper, silver, titanium, gold, aluminum, indium tin oxide, graphene or graphite.

The preparation method, wherein the first curing material adopts at least one of epoxy resin, polydimethylsiloxane or ultraviolet curing adhesive.

The preparation method, wherein the second curing material adopts at least one of epoxy resin, siloxane or ultraviolet curing adhesive.

The preparation method, wherein a thickness of the metal sheet is 20-200 μm.

The preparation method, wherein the metal sheet is an aluminum sheet, and the step of removing the metal sheet comprises specifically: adopting a ferric chloride solution to remove the aluminum sheet.

The preparation method, wherein a thickness of the first cured layer is 20-200 μm.

The preparation method, wherein in the micro-vibration sensor, the second cured layer has a crack.

The preparation method, wherein a tip of the crack has a near-tip stress field.

The preparation method, wherein the piezoelectric thin film element locates at the near-tip stress field.

The preparation method, wherein the tip of the crack forms a circular arc shape.

A micro-vibration sensor, wherein prepared by adopting any one of the preparation methods for the micro-vibration sensor described above.

Benefits: due to arranging the piezoelectric thin film element at the tip of the crack, and during a micro-vibration, the crack deforms under a force, causing a stress at the near-tip stress field of the crack to get magnified dramatically, thus converting a stress signal into an electrical signal effectively, having a plurality of features including a low detection limit and a high accuracy.

DETAILED DESCRIPTION OF EMBODIMENTS

In order to make the purpose, technical solution and the advantages of the present disclosure clearer and more explicit, here, further detailed descriptions of the present disclosure are stated, referencing to the attached drawings and some embodiments of the present disclosure. It should be understood that the detailed embodiments of the disclosure described here are merely used to explain the present disclosure only, instead of limiting the present disclosure.

Embodiment 1

Referencing to FIG. 1 to FIG. 7, the present disclosure provides an embodiment on a preparation method for a micro-vibration sensor.

Figure 1:
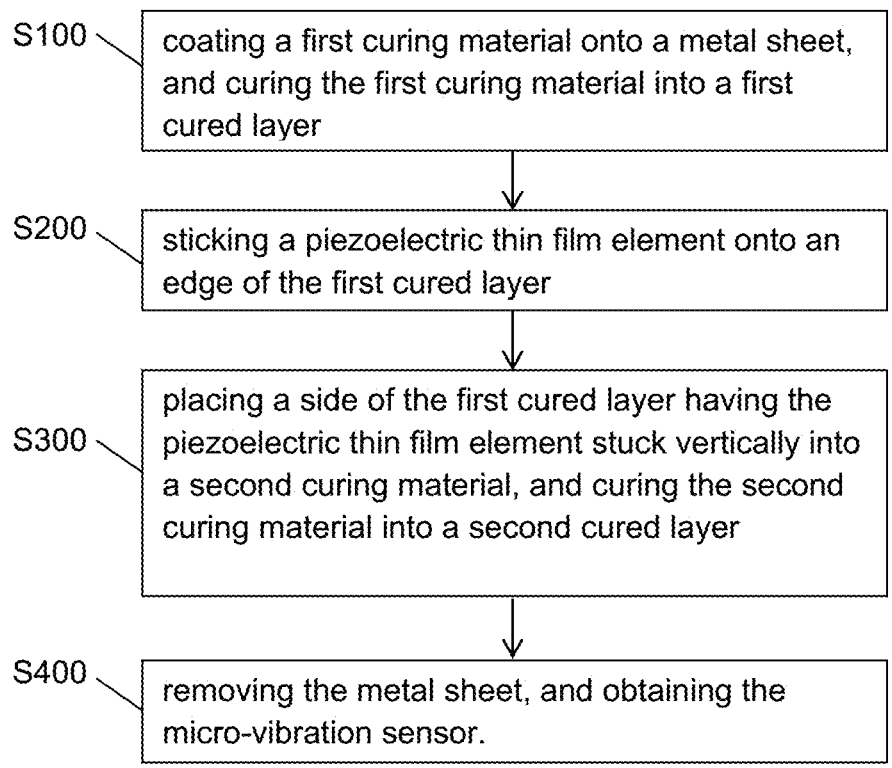
FIG. 1 illustrates a flowchart on a preparation method for the micro-vibration sensor provided in the present disclosure.
Figure 2:
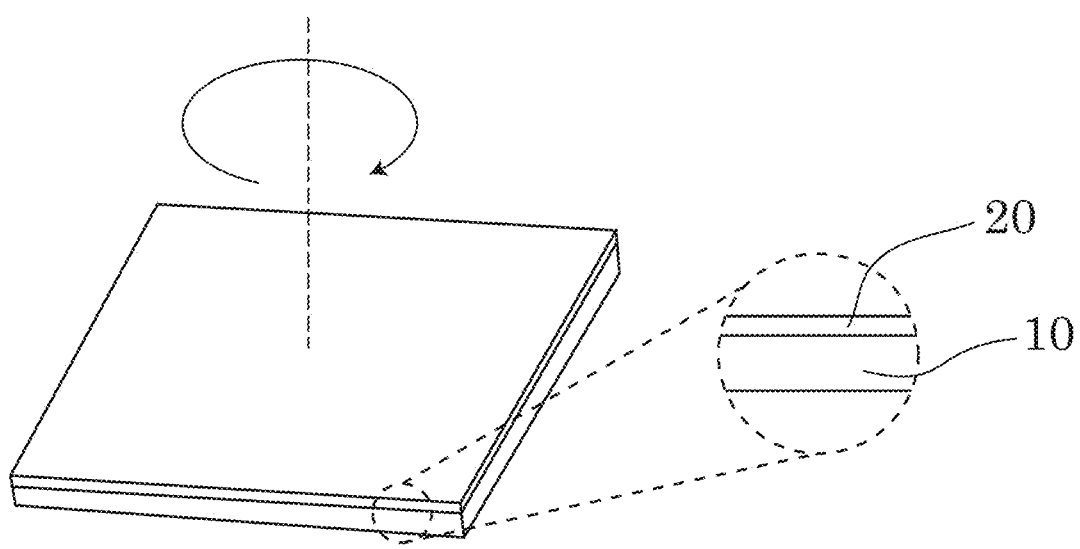
FIG. 2 illustrates a schematic diagram on a structure of the metal sheet and a first cured layer provided in the present disclosure.
Figure 3:
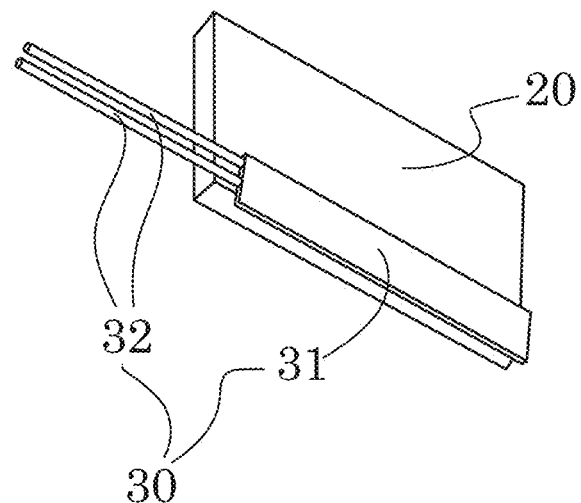
FIG. 3 illustrates a schematic diagram on a structure of a first cured layer and the piezoelectric thin film element provided in the present disclosure.
Figure 4:
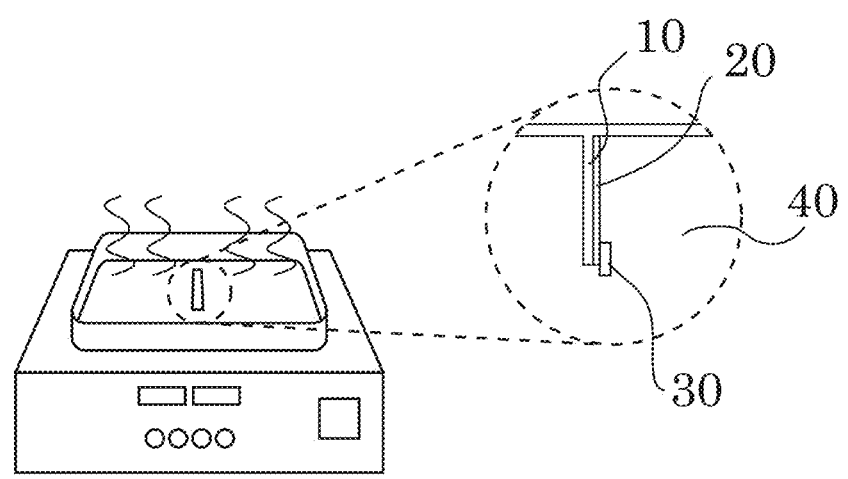
FIG. 4 illustrates a schematic diagram on a structure of the metal sheet and a second cured layer provided in the present disclosure.
Figure 5:
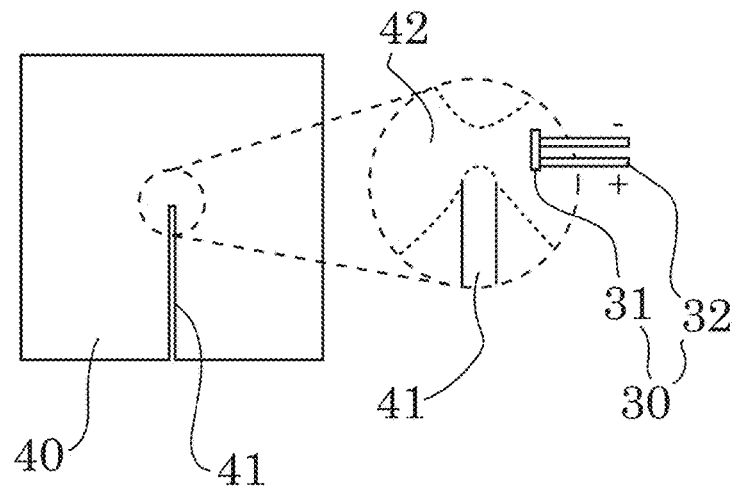
FIG. 5 illustrates a schematic diagram on a structure of the crack provided in the present disclosure.
Figure 6:
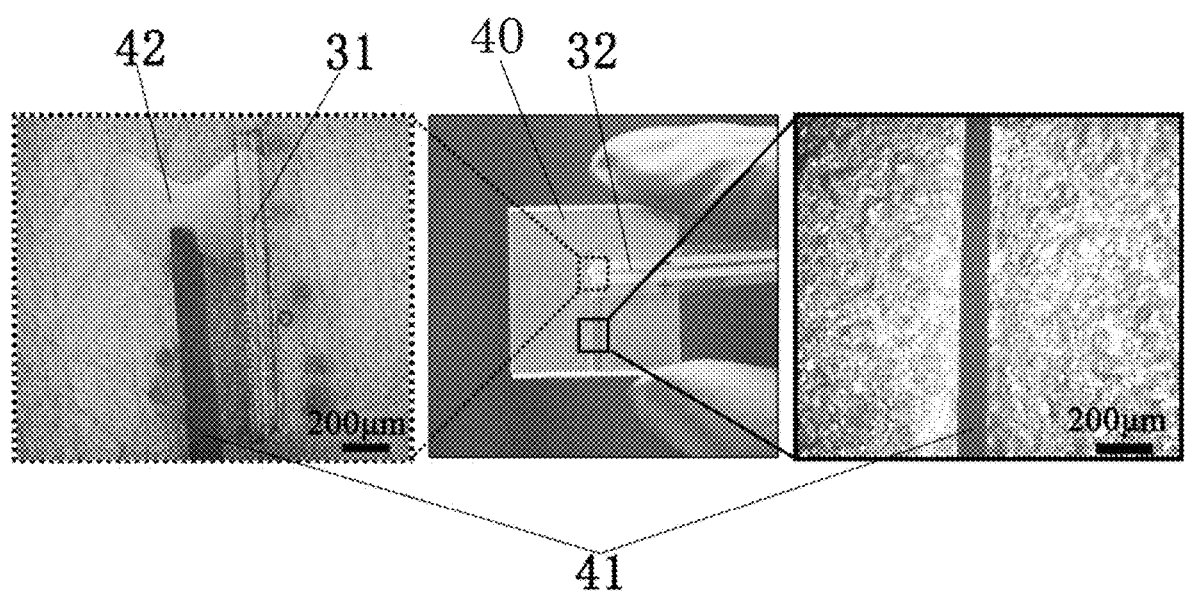
FIG. 6 illustrates a schematic diagram on a structure of the micro-vibration sensor provided in the present disclosure.

Shown as FIG. 1, a preparation method for the micro-vibration sensor comprises a plurality of following steps:

step S100, coating a first curing material onto a metal sheet 10, and curing the first curing material into a first cured layer 20 (shown as FIG. 2);

step S200, sticking a piezoelectric thin film element 30 onto an edge of the first cured layer 20 (shown as FIG. 3);

step S300, placing a side of the first cured layer 20 with the piezoelectric thin film element 30 stuck vertically into a second curing material, and curing the second curing material into a second cured layer 40 (shown as FIG. 4);

step S400, removing the metal sheet 10, and obtaining the micro-vibration sensor (shown as FIG. 5).

It is noted that, after removing the metal sheet 10, there is a crack 41 formed on the second cured layer 40, and a near-tip stress field 42 formed around a tip of the crack 41. Of course, the piezoelectric thin film element 30 is locating at the near-tip stress field 42. When a micro-vibration signal is acting on the sensor, the crack 41 will deform under a force, causing a dramatic stress amplification in the near-tip stress field 42 of the crack 41, the piezoelectric thin film element 30 locating in the near-tip stress field 42 will effectively convert a stress signal into an electric signal, and a piezoelectric signal is then output by an electrode 32 to a subsequent circuit for a further process.

The preparation method for the micro-vibration sensor provided by the present disclosure converts a stress signal into an electrical signal effectively, due to arranging the piezoelectric thin film element 30 at the tip of the crack 41, and during a micro-vibration, the crack 41 deforming under the force, making the stress in the near-tip stress field 42 of the crack 41 to magnify dramatically, therefore the micro-vibration sensor has a plurality of features including a low detection limit and a high precision.

In an embodiment of the present disclosure, in the step S100, a thickness of the metal sheet 10 is consistent with a width of the crack 41, and the thickness of the metal sheet 10 may be arranged as 20-200 μm. A length of the metal sheet 10 is consistent with a length of the crack 41, a width of the metal sheet 10 is consistent with a height of the crack 41. The length of the metal sheet 10 may be arranged as needed, for example, being arranged into 1000 μm-10000 μm, and further into 5000 μm. The width of the metal sheet 10 may also be arranged as needed, for example, being arranged into 200 μm-2000 μm, and further into 1000 μm.

The metal sheet 10 may adopt an aluminum sheet, a copper sheet, an iron sheet, or more. Of course, the metal sheet 10 may be substituted by a plurality of other materials, as long as being easy to remove. Around the metal sheet 10, it is in an arc shape, that is, four side surfaces of the metal sheet 10 are in arc shapes, of course, the side surface of a wide side of the metal sheet 10 is in a round arc shape, and when forming the crack 41, the tip of the crack 41 forms a circular arc shape, a circular arc shaped tip of the crack 41 makes it not easy to be torn, which is helpful to improve a service life of the crack 41. The arc is a semicircle, and a curvature radius of the tip of the crack 41 is half of the thickness of the metal sheet 10.

In an embodiment of the present disclosure, the first curing material may adopt at least one of epoxy resin, siloxane or ultraviolet curing adhesive; and the epoxy resin may select epoxy resin AB glue, the siloxane may adopt polydimethylsiloxane.

A curing method of the first curing material may be determined based on the first curing material, for example, when adopting the epoxy resin, a heating method may be adopted, and in order to facilitate to stick the piezoelectric thin film element 30 onto the first cured layer 20, it is possible to heat under 30-50° C. for 1-5 hours, which can improve an adhesion of the epoxy resin. Of course, when the first curing material is the ultraviolet curing adhesive, it is possible to solidify through an ultraviolet light shining. In order to facilitate to stick the piezoelectric thin film element 30 onto the first cured layer 20, it is not necessary to fully cure the first curing material, instead, it is only needed to cure the first curing material in a liquid state for a certain adhesion.

A thickness of the first cured layer 20 is 20-200 μm, the thickness of the first cured layer 20 relates to a distance between the tip of the crack 41 and the piezoelectric thin film element 30. In order to make the piezoelectric thin film element 30 locate in the near-tip stress field 42 of the crack 41, the thickness of the first cured layer 20 shall be arranged as needed. The thickness of the first cured layer 20 is 100 μm.

In an embodiment of the present disclosure, the piezoelectric thin film element 30 in the step S200 is formed by packaging after connecting an electrode 32 onto both sides of a piezoelectric thin film 31.

Specifically, the piezoelectric thin film 31 is made of at least one material of polyvinylidene fluoride, zinc oxide, piezoelectric material of $PbTiO_3$, piezoelectric crystal or piezoelectric ceramic. A common piezoelectric crystal may be: sphalerite, cristobalite, tourmaline, sphalerite, GaAs, barium titanate and a derived structure crystals thereof, $KH_2PO_4$, $NaKC_4H_4O_6.4H_2O$ (Rochelle salt), sugar and more. A common piezoelectric ceramics may be: a barium titanate system, a lead zirconate titanate binary system, and a ternary system combined by adding a third $ABO_3$ (wherein A means a divalent metal ion, B means a tetravalent metal ion or a plurality of ions having a sum of positive tetravalent) typed compound to a binary system, including $Pb(Mn_{1/3}Nb_{2/3})O_3$, $Pb(Co_{1/3}Nb_{2/3})O_3$ and more. And if adding a fourth or more compounds to the ternary system, a piezoelectric ceramic with a quaternary system or a multi-component system may be formed. In addition, there is a meta-niobate-based piezoelectric ceramic, including a potassium sodium niobate ($Na_{0.5}.K_{0.5}.NbO_3$), a barium strontium niobate ($Ba_x.Sr_{1-x}.Nb_2O_5$) and more, which contains no toxic lead, being environmentally friendly.

The electrode 32 is formed by depositing, evaporating, sputtering or brushing an electrode material onto the piezoelectric thin film 31. The electrode material adopts at least one of copper, silver, titanium, gold, aluminum, indium tin oxide, graphene or graphite. A packaging method is adopting a PET film packaging.

The piezoelectric thin film element 30 after being packaged has a long shape. When the piezoelectric thin film element 30 is stuck onto the edge of the first cured layer 20, specifically it is stuck along a wide side of the first cured layer 20 (wherein, a length and a width of the first cured layer 20 are consistent with a length and a width of the metal sheet 10). A length of the piezoelectric thin film 31 is smaller than the width of the first cured layer 20, while a length of the piezoelectric thin film element 30 (including the length of the piezoelectric thin film 31 and a length of the electrode 32) is larger than the width of the first cured layer 20, so that it is convenient for the electrode 32 to protrude out of the second cured layer 40 and connect with a subsequent circuit.

When sticking the piezoelectric thin film element 30 onto the edge of the first cured layer 20, the piezoelectric thin film element 30 is not fully attached to the first cured layer 20, instead, it is partially attached to the first cured layer 20 and partially protruded out of the first cured layer 20, so the piezoelectric thin film element 30 is locating in a middle position of the near-tip stress field 42. Since a strain at the near-tip stress field 42 is severe, it helps to improve an accuracy of the piezoelectric thin film element 30. Of course, it is possible to coat the first curing material onto both sides of the metal sheet 10, before sticking two piezoelectric thin film elements 30 separately, which makes it possible to perform a measurement using both piezoelectric thin film elements 30, to further improve an accuracy of the measurement.

In an embodiment of the present disclosure, the step S300 comprises specifically: placing a wide side of the first cured layer 20 vertically into the second curing material, while the second curing material may be loaded in a petri dish, specifically, in a petri dish made of polystyrene. The piezoelectric thin film element 30 is placed at a center of the petri dish, that is, placing one wide side of the first cured layer 20 at the center of the petri dish, and another wide side thereof near an edge of the petri dish. After curing, the piezoelectric thin film element 30 will locate at a center of the second cured layer 40.

The second curing material adopts at least one of epoxy resin, siloxane or ultraviolet curing adhesive, the second curing material may be same as or different to the first curing material, the second curing material is same as the first curing material. A thickness of the second curing material is no more than a width of the first curing material, the thickness of the second curing material is same as the width of the first curing material.

The second curing material being cured into the second cured layer 40 may also be determined according to the first curing material. In an embodiment, when the epoxy resin is adopted, it may adopt a heating method, heating for 15-30 hours under 30-50° C., to make both the first curing material and the second curing material fully cured.

In an embodiment of the present disclosure, in the step S400, the metal sheet 10 may adopt an aluminum sheet, and the step of removing the metal sheet 10 comprises specifically: adopting a ferric chloride solution to remove the aluminum sheet.

Specifically, the ferric chloride solution is a ferric chloride solution having a concentration of 5 mol/L. A purpose is completely etching away the aluminum sheet fixed in the epoxy resin, before forming the crack 41. After removing the aluminum sheet, and demoulding from the petri dish made of polystyrene before trimming, the micro-vibration sensor will be obtained (shown as FIG. 6). The trimming stated here may trim into a certain shape as needed.

A first comparative embodiment, different to the embodiment on the preparation method for the micro-vibration sensor described above, wherein the piezoelectric thin film element 30 is stuck onto a middle area of the first cured layer 20, by changing a sticking position of the piezoelectric thin film element 30 in the step S200.

A second comparative embodiment, different to the embodiment on the preparation method for the micro-vibration sensor described above, wherein no metal sheet 10 is adopted, thus no crack 41 is formed.

Figure 7:
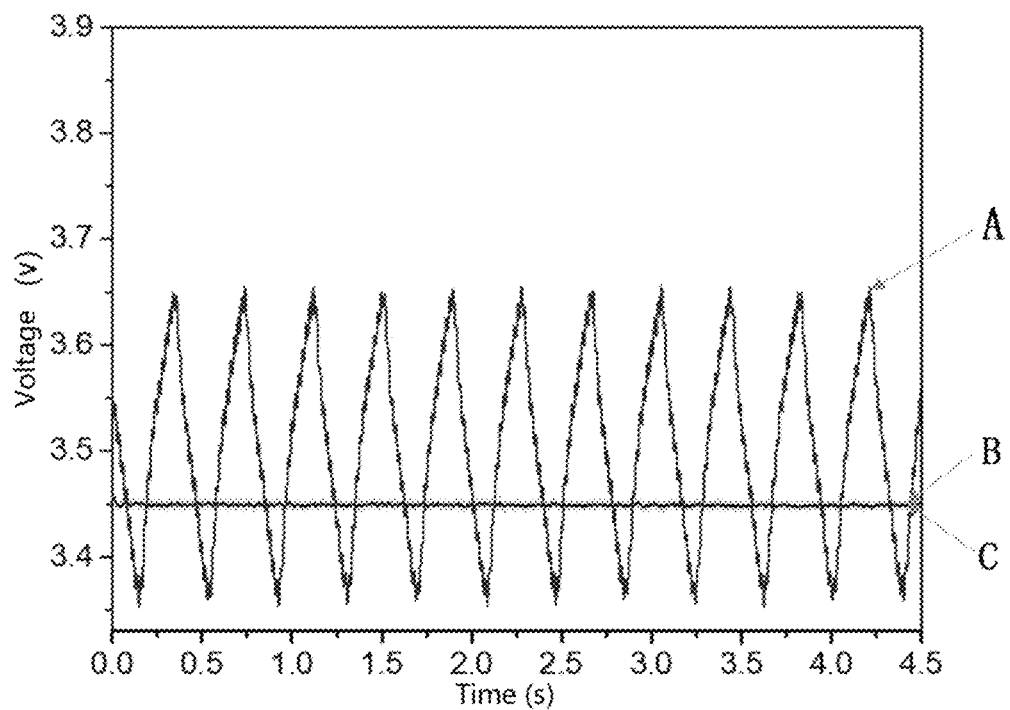
FIG. 7 illustrates a test result diagram on the micro-vibration sensor provided by the present disclosure to a comparative embodiment 1 and a comparative embodiment 2.

Excited by a mechanical vibration, the micro-vibration sensor in the embodiment on the preparation method for the micro-vibration sensor provided in the present disclosure, may detect an electrical signal (shown as a test voltage line A in FIG. 7), while neither the first comparative embodiment nor the second comparative embodiment can detect the electrical signal (shown as a test voltage line B and a test voltage line C in FIG. 7).

Embodiment 2

The present disclosure further provides an embodiment on a micro-vibration sensor:

The embodiment on the micro-vibration sensor provided by the present disclosure is prepared by adopting any one of the preparation methods for the micro-vibration sensor described above, details have been stated above.

All above, the present disclosure provides a micro-vibration sensor and a preparation method thereof, the method comprises a plurality of following steps: coating a first curing material onto a metal sheet, and curing the first curing material into a first cured layer; sticking a piezoelectric thin film element onto an edge of the first cured layer; placing a side of the first cured layer having the piezoelectric thin film element stuck vertically into a second curing material, and curing the second curing material into a second cured layer; removing the metal sheet, and obtaining the micro-vibration sensor. Due to arranging the piezoelectric thin film element at the tip of the crack, and during a micro-vibration, the crack deforms under a force, causing a stress at the near-tip stress field of the crack to get magnified dramatically, thus converting a stress signal into an electrical signal effectively, having a plurality of features including a low detection limit and a high accuracy.

It should be understood that, the application of the present invention is not limited to the above examples listed. Ordinary technical personnel in this field can improve or change the applications according to the above descriptions, all of these improvements and transforms should belong to the scope of protection in the appended claims of the present invention.

What is claimed is:

1. A preparation method for a micro-vibration sensor, comprising:
    coating a first curing material onto a metal sheet, and curing the first curing material into a first cured layer;
    adhering a piezoelectric thin film element onto an edge of the first cured layer;
    placing a side of the first cured layer having the piezoelectric thin film element adhered thereon, vertically into a second curing material, and curing the second curing material into a second cured layer; and
    subsequently removing the metal sheet, thus obtaining the micro-vibration sensor.

2. The preparation method according to claim 1, wherein the piezoelectric thin film element is formed by packaging after connecting an electrode onto each of both sides of a piezoelectric thin film.

3. The preparation method according to claim 2, wherein the piezoelectric thin film is made of material selected from the group consisting of a polyvinylidene fluoride, a zinc oxide, a piezoelectric material of $PbTiO_3$, a piezoelectric crystal or a piezoelectric ceramic.

4. The preparation method according to claim 2, wherein the electrode is formed by depositing, evaporating, sputtering or brushing an electrode material onto the piezoelectric thin film.

5. The preparation method according to claim 4, wherein the electrode material is selected from the group consisting of copper, silver, titanium, gold, aluminum, indium tin oxide, graphene or graphite.

6. The preparation method according to claim 1, wherein the first curing material is selected from the group consisting of epoxy resin, polydimethylsiloxane or ultraviolet curing adhesive.

7. The preparation method according to claim 1, wherein the second curing material is selected from the group consisting of epoxy resin, siloxane or ultraviolet curing adhesive.

8. The preparation method according to claim 1, wherein a thickness of the metal sheet is 20-200 μm.

9. The preparation method according to claim 1, wherein the metal sheet is an aluminum sheet, and the step of removing the metal sheet comprises adopting a ferric chloride solution to remove the aluminum sheet.

10. The preparation method according to claim 1, wherein a thickness of the first cured layer is 20-200 μm.

11. The preparation method according to claim 1, wherein in the micro-vibration sensor, the second cured layer has a crack formed.

12. The preparation method according to claim 11, wherein a tip of the crack forms a near-tip stress field.

13. The preparation method according to claim 12, wherein the piezoelectric thin film element is located at the near-tip stress field.

14. The preparation method according to claim 12, wherein the tip of the crack forms a circular arc shape.

15. A micro-vibration sensor prepared by adopting the preparation methods for the micro-vibration sensor according to claim 1.

\* \* \* \* \*